(12) United States Patent
Ker et al.

(10) Patent No.: US 6,744,107 B1
(45) Date of Patent: Jun. 1, 2004

(54) ESD PROTECTION CIRCUIT WITH SELF-TRIGGERED TECHNIQUE

(75) Inventors: Ming-Dou Ker, Hsinchu (TW); Kuo-Chun Hsu, Miaoli (TW); Wen-Yu Lo, Taichung (TW)

(73) Assignee: Silicon Integrated Systems Corp., Hsin chu (TW)

( * ) Notice: Subject to any disclaimer, the term of this patent is extended or adjusted under 35 U.S.C. 154(b) by 0 days.

(21) Appl. No.: 10/325,892

(22) Filed: Dec. 23, 2002

(51) Int. Cl.[7] ............................................. H01L 29/72
(52) U.S. Cl. ....................... 257/401; 257/355; 257/357; 257/370
(58) Field of Search ................... 257/355, 357, 257/370, 401

(56) References Cited

U.S. PATENT DOCUMENTS 5,831,316 A * 11/1998 Yu et al. .................... 257/401

* cited by examiner

Primary Examiner—Edward Wojciechowicz
(74) Attorney, Agent, or Firm—Birch, Stewart, Kolasch & Birch, LLP

(57) ABSTRACT

An electrostatic discharge protection circuit. The electrostatic discharge protection circuit utilizes the non-uniform triggering of multi-finger gate-grounded NMOS. The source of the finger which has the potential to trigger on is coupled to the base terminal of all the parasitic bipolar transistor of all the other multi-finger gate-ground NMOS structures. Thus, the finger which has the potential to be triggered can be used as a triggering device to trigger the other finger devices during an ESD event. By using this method, the ESD protection NMOS or PMOS, realized with multi-finger layout structure, can be uniformly triggered on to discharge ESD current. Therefore, it can have a high ESD robustness in a small layout area.

22 Claims, 7 Drawing Sheets

ESD PROTECTION CIRCUIT WITH SELF-TRIGGERED TECHNIQUE

BACKGROUND OF THE INVENTION

1. Field of the Invention

The present invention relates to ESD protection circuits with self-triggered technique, and particularly to ESD protection circuits uniformly triggered.

2. Description of the Related Art

Electrostatic discharge (ESD) is a transient process of high energy transformation from external to internal of an IC when the IC is floated. Total discharge process takes about 100 ns. Also, several hundred or even several thousand volts are transferred during ESD stress. Such high voltage transformation will break down the gate oxide of an input stage and cause circuit error. As the thickness of gate oxide is scaled down constantly, it is more and more important that a protected circuit or device must be designed to protect the gate oxide and to discharge ESD stress.

Models related to ESD stress are divided into human body model (HBM), machine model (MM) and charged device model (CDM). For commercial IC products, the general ESD specification is required that IC products must pass these tests, for example, HBM ESD stress of greater than +/−2 kV, MM ESD stress of greater than +/−200V and CDM ESD stress of greater than +/−1 kV, respectively. In order to sustain such high ESD voltage, efficient and robust protection circuits, usually requiring large layout dimensions, should be used.

To achieve the above objective, some protection circuits have been proposed:

(1)Gate Grounded NMOS and Gate to VDD PMOS

A gate grounded NMOS and a gate shorted to VDD PMOS used as protection circuits for the input/output pad are shown in FIG. 1. In normal operation, the ESD protection circuits are in a non-conductive state so that they do not interfere with the voltage level at the input/output pad. In all process generations of CMOS technology, the breakdown voltage of drain junction is almost smaller than that of gate oxide, a basic characteristic in the design of ESD protection circuits. The difference in the breakdown voltage between drain junction and gate oxide gets smaller as the gate length is shrunk. The design margin is also more and more narrow, that is to say, if the design or process technology is not optimum, the gate oxide will be damaged before the junction breakdown of drain terminal occurs. In the positive-to-VSS ESD zapping condition, the avalanche breakdown occurs in the drain terminal of the gate grounded NMOS Mn, and substrate current is also generated. The base volatge of parasitic lateral NPN (drain/substrate/source) is elevated because of the voltage drop across the substrate resistor due to the substrate current. As soon as the base/emitter junction is forward biased, the lateral NPN will be triggered to bypass ESD current. Also, the voltage of the input/output pad will be clamped at the holding voltage of the lateral NPN. In the negative-to-VSS ESD zapping condition, parasitic diode Dn (P_sub/n+_drain) is forward biased to bypass ESD current and this process is independent of any breakdown mechanism. In the negative-to-VDD ESD zapping condition, avalanche breakdown occurs in the drain terminal of gate shorted to VDD PMOS Mp. Then the parasitic lateral PNP (drain/n_well/source) is forward biased to bypass ESD current because of the same mechanism as the gate grounded NMOS Mn. In the positive-to-VDD ESD zapping condition, parasitic junction diode Dp (p+_drain/n_well) is forward biased to bypass ESD current and this process is also independent on any breakdown mechanism.

(2)Input Protection Circuits with Equal Substrate Resistance

In traditional multi-finger NMOS layout technique, the center finger NMOS is usually turned on first because of its higher substrate resistance. As the center finger NMOS is turned on, the pad voltage will be kept at a lower potential and makes other finger inactive. All the ESD current will focus on the center finger NMOS, causing failure by over heating. For NMOS, using this layout style, the ESD level cannot be improved by increasing the layout area of the protection circuit. Thus, a new layout style, shown in FIG. 2, is proposed in U.S. Pat. No. 5,811,856 by TSMC. The new layout style is accomplished by adding P+ diffusion, adjacent to the source terminal of each finger NMOS device to make the base resistance of each parasitic bipolar transistor approximately equal. When an ESD zapping is applied to the input/output pad, the parasitic bipolar transistor will conduct simultaneously and with equal current, thus preventing over-heating from causing circuit failure.

(3)Gate Coupled Technique for ESD Protection

The ESD protection circuit, shown in FIG. 3, includes capacitors Cp1, Cn1, resistors Rp, Rn, a NMOS transistor Mn, and a PMOS transistor Mp. The NMOS Mn and the PMOS Mp transistors are configured with drains connected to the input/output pad 21 and sources connected to VSS and VDD respectively. The capacitors Cp1, Cn1 are connected between the input/output pad 21 and the gates of the NMOS Mn and the PMOS Mp transistors. The resistors Rp, Rn are connected between VSS and VDD and the gates of the NMOS Mn and the PMOS Mp transistors. The values of the capacitors Cp1, Cn1 and the resistors Rp, Rn can be tuned for coupling a portion of voltage to the gates of the NMOS Mn and the PMOS Mp transistors only under ESD zapping. Using the present protection circuit, the triggered voltage of ESD protection device can be lowered to protect the thin gate oxide of the internal circuit as soon as possible. In addition, the disadvantage of non-uniform turning on NMOS also can be improved.

(4)Substrate Triggered Technique for ESD Protection

The present ESD protection circuit shown in FIG. 4, similar to gate coupled technique, also includes a capacitor C1, a resistor R1 and a NMOS M5 transistor. The NMOS transistor is configured with a drain connected to the input/output pad 8 and a source connected to VSS. The gate and the source of the NMOS MS transistor are shorted together. The capacitor C1 is connected between the input/output pad 8 and the body of the NMOS MS transistor. The resistor R1 is connected between VSS and the body of the NMOS M5 transistor. The values of the capacitor C1 and the resistor R1 can be tuned for coupling a portion of voltage to the body of the NMOS M5 transistor only under ESD zapping. Therefore, the parasitic NPN bipolar transistor can be triggered on without through avalanche breakdown mechanism. In addition, the triggered voltage of the NMOS transistor can be lowered and the disadvantage of non-uniform turning on for NMOS can be improved by using this technique.

The ESD protection circuits mentioned above usually require large layout dimension and can not be turned on uniformly. There is a need for an ESD protection circuit that turns on uniformly and saving layout area.

SUMMARY OF THE INVENTION

It is therefore an object of the present invention to provide an ESD protection circuit with uniform turning on.

To achieve the above objects, the present invention provides an ESD protection circuit with self-triggered techniques.

The present invention provides a multi-finger NMOS in which a center finger device with the largest substrate resistance has its source coupled to all bases of the parasitic bipolar transistors of the other finger devices. When an ESD zapping occurs in an input/output pad, the center finger device is triggered on and results in a current to turn on the other finger devices.

The present invention provides a multi-finger NMOS in which a center finger device with the largest substrate resistance has its source coupled to all gates of the other finger devices. When an ESD zapping occurs in an input/output pad, the center finger device is triggered on and reduces the triggered voltages of the other finger devices.

The present invention provides a multi-finger NMOS in which a center finger device with the largest substrate resistance has its source coupled to all bases of the parasitic bipolar transistors of the other finger devices and to all gates of the other finger devices. When an ESD zapping occurs in an input/output pad, the center finger device is triggered on and results in a current to turn on the other finger devices.

BRIEF DESCRIPTION OF THE DRAWINGS

The aforementioned objects, features and advantages of this invention will become apparent by referring to the following detailed description of the preferred embodiment with reference to the accompanying drawings, wherein.

DETAILED DESCRIPTION OF THE INVENTION

The present invention discloses ESD protection circuits with self-substrate triggered technique to turn on multi-finger gate-grounded NMOS ESD structure uniformly. Instead of connecting a source terminal to ground, the source of the center finger device is connected to the base terminals of the parasitic bipolar transistors in multi-finger gate-grounded NMOS structure. The center finger device can be used as a triggering device to trigger the other finger devices. The new invention does not increase layout areas, but greatly improves ESD robustness much more.

The First Embodiment
(Self-substrate Triggered Technique)

The I-V characteristic of gate-grounded NMOS transistor has a significant snapback phenomenon so that the multi-finger NMOS protection device can not be turned on uniformly. Moreover, under traditional layout, the parasitic bipolar transistor of center finger device usually has the largest substrate (base) resistance, thus is usually triggered on easily. As soon as the center finger device is triggered, the voltage on the I/O pad will be clamped and have difficulty becoming larger than the avalanche breakdown voltage of drain-to-substrate/well junction. In other words, all the ESD current will be discharged by this center finger NMOS, and easily damaging the center finger NMOS. Hence, the protection circuit will lose its protection function and the IC products will likely have problems passing ESD specification. As long as non-uniform turning on remains unsolved, the ESD level also cannot be improved, even by increasing the layout area. This innovation simply utilizes drawback, wherein the center finger device is usually turned on first alone, to promote all fingers turning on uniformly to share ESD current.

Figure 1:
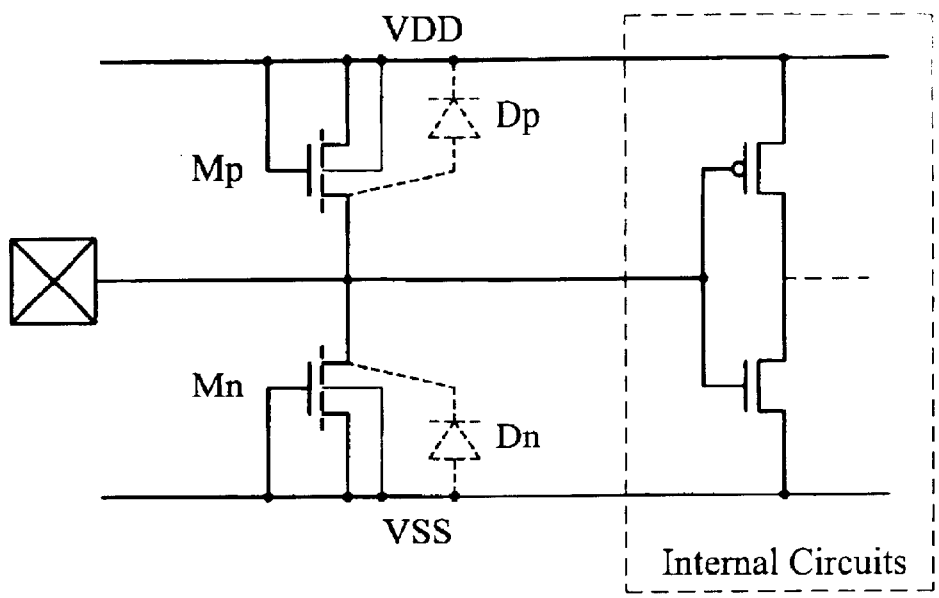
FIG. 1 is a schematic diagram showing an ESD protection circuit having a gate ground NMOS and a gate to VDD PMOS.
Figure 2:
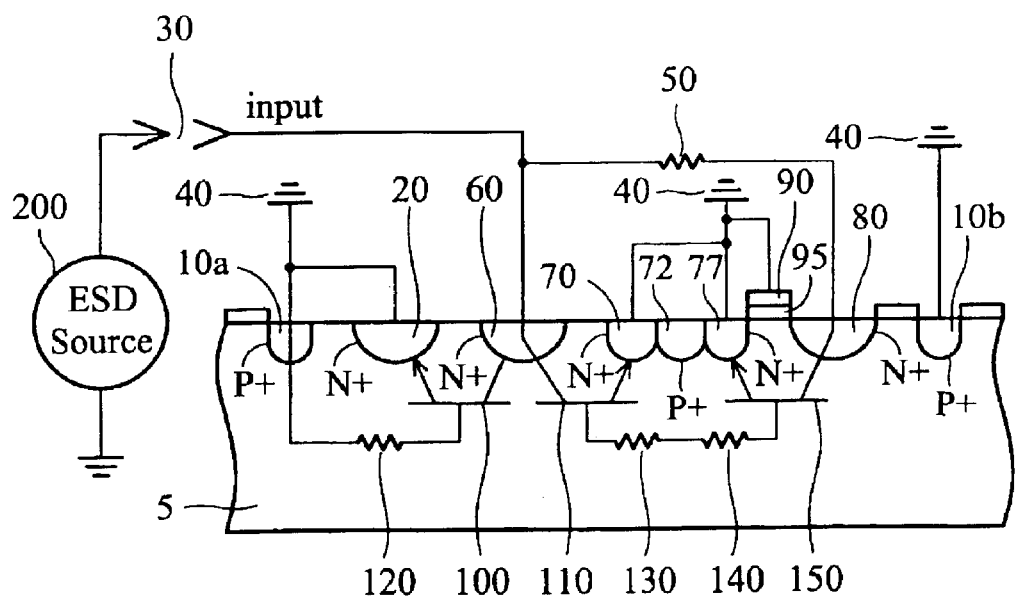
FIG. 2 is a schematic diagram showing an ESD protection circuit with equal substrate resistance.
Figure 3:
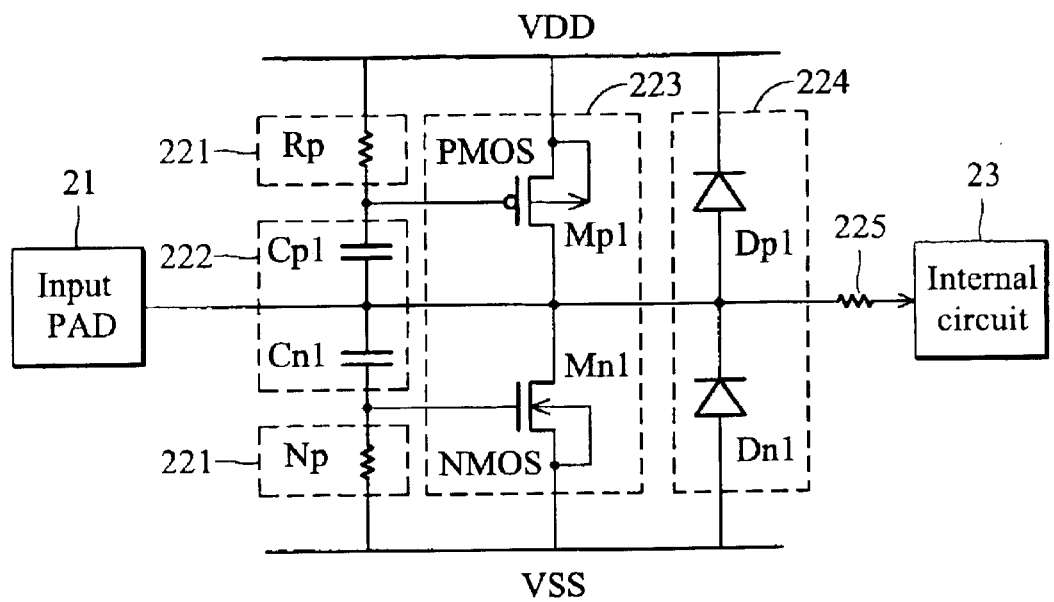
FIG. 3 is a schematic diagram showing an ESD protection circuit with gate coupled technique.
Figure 4:
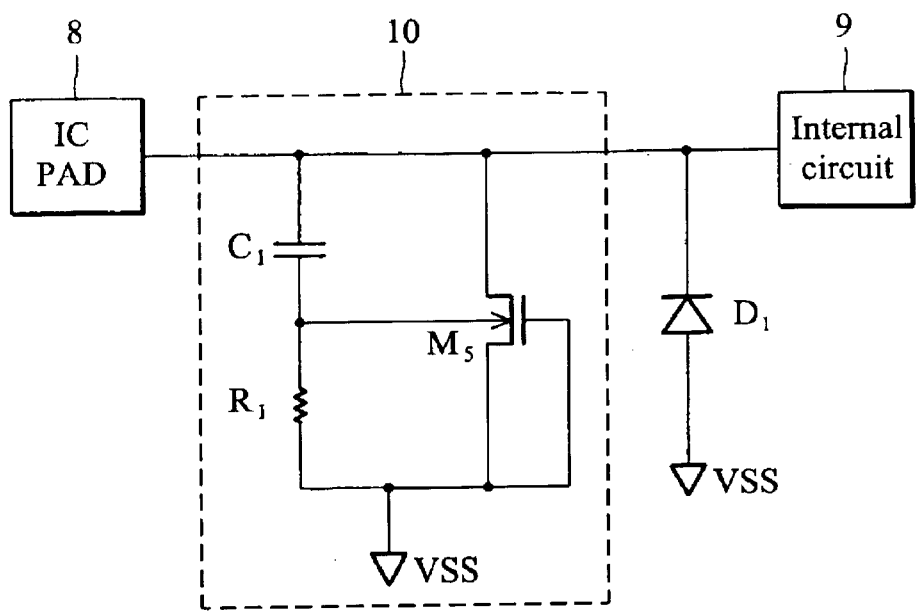
FIG. 4 is a schematic diagram showing an ESD protection circuit with substrate triggered technique.
Figure 5:
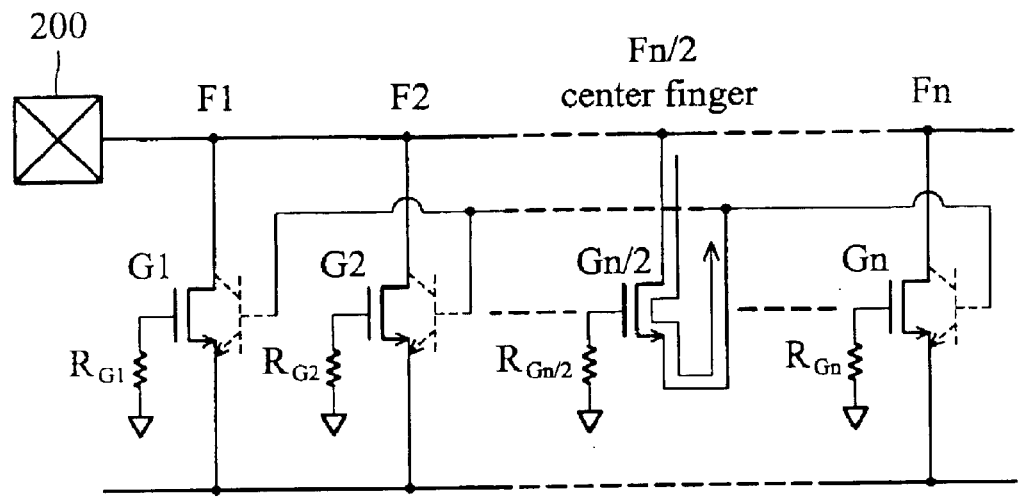
FIG. 5 is a schematic diagram showing an ESD protection circuit with self-substrate triggered technique.

FIG. 5 shows an ESD protection circuit of the first embodiment. The ESD protection circuit in FIG. 5 includes gate-grounded finger NMOS F1–Fn, having parasitic bipolar transistors, and drains coupled to the I/O pad 200, gates coupled to a ground potential, and sources coupled to the ground potential except for the center gate-ground finger NMOS Fn/2. At least, a finger device having the largest substrate resistance has its source coupled to bases of the parasitic bipolar transistors. The source of the center finger device Fn/2, having the largest substrate resistance, is connected to bases of the parasitic bipolar transistors of the other gate-ground finger NMOS instead of connecting to ground.

Figure 6:
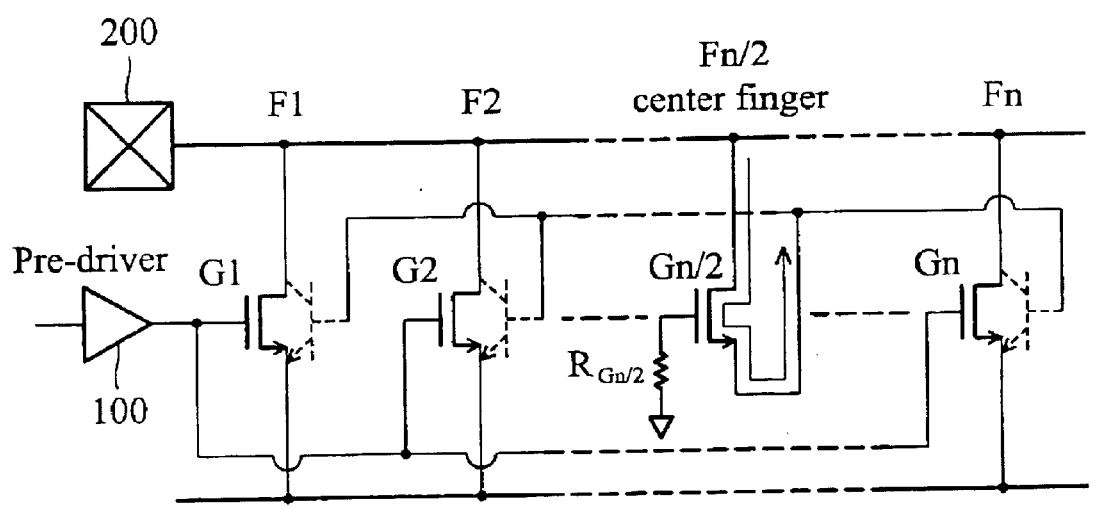
FIG. 6 is a schematic diagram showing an ESD protection circuit with self-substrate triggered technique.

FIG. 6 shows another ESD protection circuit of the first embodiment. The ESD protection circuit in FIG. 6 includes finger NMOS F1–Fn, having parasitic bipolar transistors, and having drains coupled to the I/O pad 200, gates coupled to a pre-driver 100, and sources coupled to the ground potential except for the center finger NMOS Fn/2. At least, a finger device, the center finger NMOS, having the largest substrate resistance has its source coupled to bases of the parasitic bipolar transistors and gate coupled to the ground potential.

Figure 7:
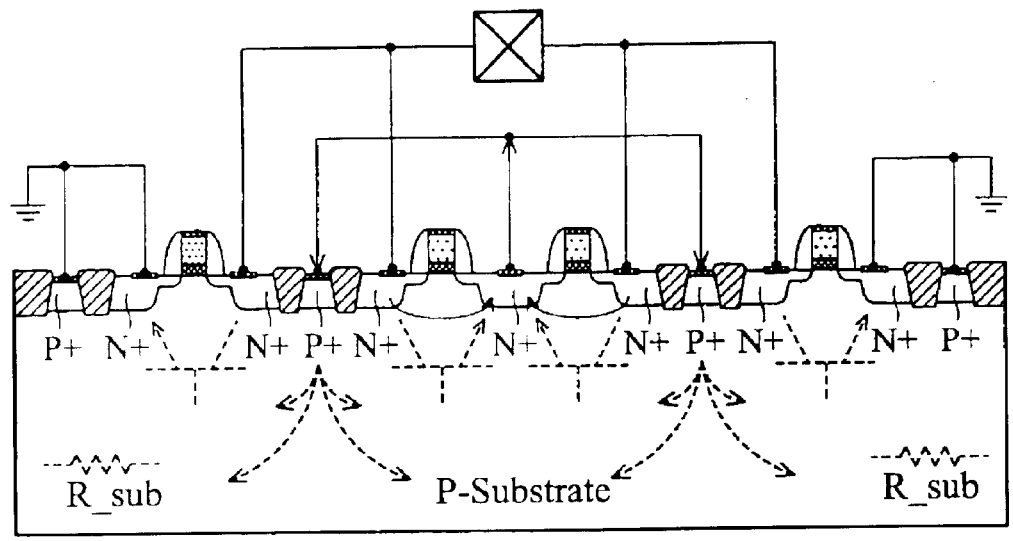
FIG. 7 shows a cross section of a ESD protection circuit with self-substrate triggered technique.

The invention of I/O pad shown in FIG. 5/FIG. 6 is configured similar to the gate-grounded NMOS, except for the center finger device. The trigger mechanisms in FIG. 5/FIG. 6 are the same. When an ESD pulse is applied to the I/O pad 200, the center finger device Fn/2 is turned on and then the current flows down from the drain, the channel, and the source to the bases of all the other parasitic NPN bipolar transistors. The current from the center finger NMOS Fn/2 results in voltage drops across the substrate (base) resistors and the voltages of base terminal will be increased. This will make the parasitic bipolar transistors turn on more efficiently to discharge the ESD current and improve the ESD level. FIG. 7 shows the layout and cross-section of the device in this invention, respectively. The layout area of the GGN-MOS and this embodiment are the same. That is, the ESD level can be improved without increasing the layout area and cost.

The Second Embodiment
(Self-gate Triggered Technique)

Figure 8:
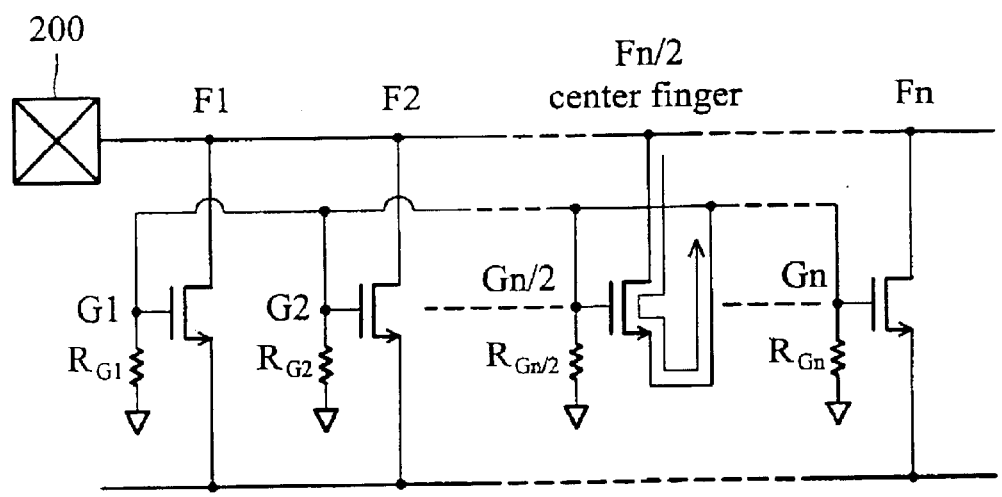
FIG. 8 is a schematic diagram showing an ESD protection circuit with self-gate triggered technique.

FIG. 8 shows an ESD protection circuit utilizing the self-gate triggered mechanism of the second embodiment. The ESD protection circuit in FIG. 8 includes finger NMOS F1-Fn, having parasitic bipolar transistors, and having drains coupled to the I/O pad 200, gates coupled to a ground potential, and sources coupled to the ground potential except for the center gate-ground finger NMOS Fn/2. At least, the center finger device Fn/2, having the largest substrate resistance, has its source coupled to gates of all the other finger NMOS.

Figure 9:
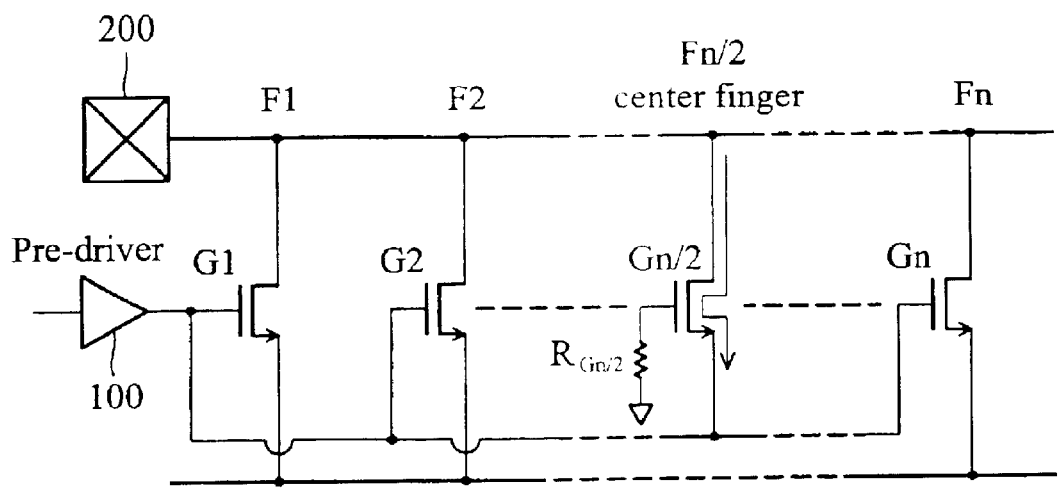
FIG. 9 is a schematic diagram showing an ESD protection circuit with self-gate triggered technique.

The ESD protection circuit in FIG. 9 includes finger NMOS F1–Fn, having parasitic bipolar transistors, and having drains coupled to the I/O pad 200, gates coupled to a pre-driver 100, and sources coupled to the ground potential except for the center gate-ground finger NMOS Fn/2. At least, the center finger device Fn/2, having the largest substrate resistance, has its source coupled to gates of all the other finger NMOS and gate coupled to the ground potential.

Figure 10:
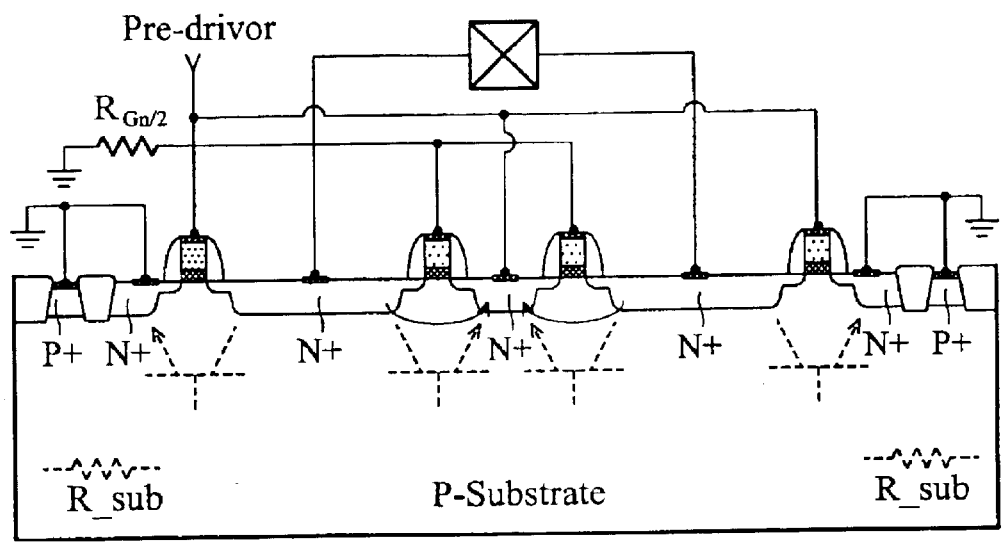
FIG. 10 shows a cross section of a ESD protection circuit with self-gate triggered technique.

The configuration of the electrostatic discharge circuit in FIG. 9 is similar to that in FIG. 8 except for the center finger NMOS Fn/2. If the gate of the center finger device Fn/2 is connected to the pre-drive 100 and its source, when the gate voltage is high, the other finger devices will pull the voltage of the output pad 200 to low level. The center finger NMOS Fn/2 is non-conductive initially because the gate is shorted to its source. However, the drain and source of the center finger NMOS Fn/2 will change each other electrically, as soon as the voltage of the output pad 200 reaches the low level. Therefore, the center finger NMOS Fn/2 will be turned on and the current will flow from the pre-drive to the output pad 200. This may cause malfunction, so the gate Fn/2 of the center finger NMOS Fn/2 in FIG. 9 is connected to the ground potential through a resistor RGn/2. While a zapping positive to VSS is applied to the I/O pad 200, the center finger device Fn/2 in FIG. 8 or in FIG. 9 is triggered on and then the current will flow to the gate resistors RG1–RGn of all the other finger devices for the input/output pad 200 or to the pre-driver connected to the gates of all the other finger devices for the output pad 200. This elevates the gate voltages of all finger devices due to the voltage drops across gate resistor RGi and then reduce the trigger voltages of parasitic bipolar transistors while increasing the gate-source voltage Vgs, that is, the protection finger devices will be triggered on faster and more uniformly. The corresponded cross-section is shown in FIG. 10.

The Third Embodiment
(Self Substrate and Gate Triggered Technique)

Figure 11:
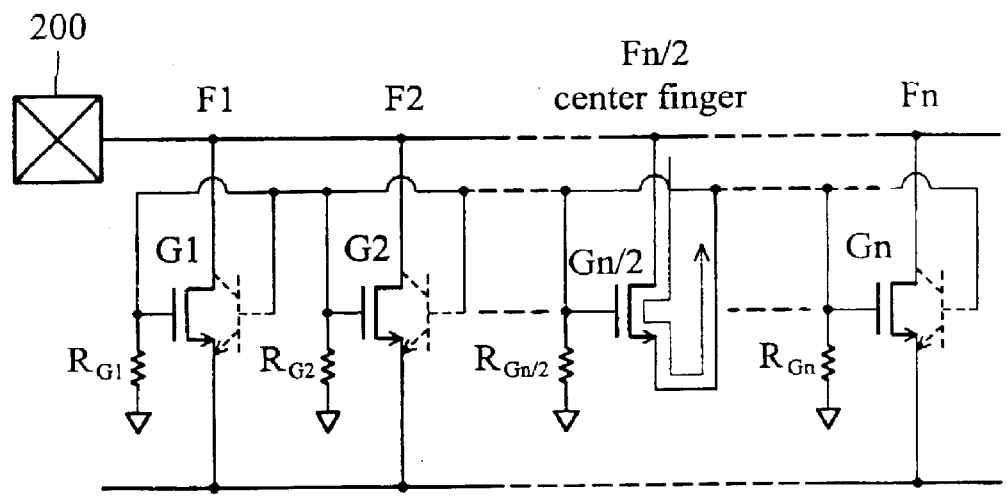
FIG. 11 is a schematic diagram showing an ESD protection circuit with self-substrate and self-gate triggered technique.

Combining the ideas of FIG. 5 and FIG. 8, the third embodiment is illustrated in FIG. 11. FIG. 11 shows an ESD protection circuit utilizing the self-substrate and self-gate triggered mechanisms of the third embodiment. The ESD protection circuit in FIG. 11 includes finger NMOS F1–Fn, having parasitic bipolar transistors, and having drains coupled to the I/O pad 200, gates coupled to a ground potential, and sources coupled to the ground potential except for the center gate-ground finger NMOS Fn/2. At least, the center finger device Fn/2, having the largest substrate resistance, has its source coupled to gates of all the other finger NMOS and bases of the bipolar transistors of all the other finger NMOS.

Figure 12:
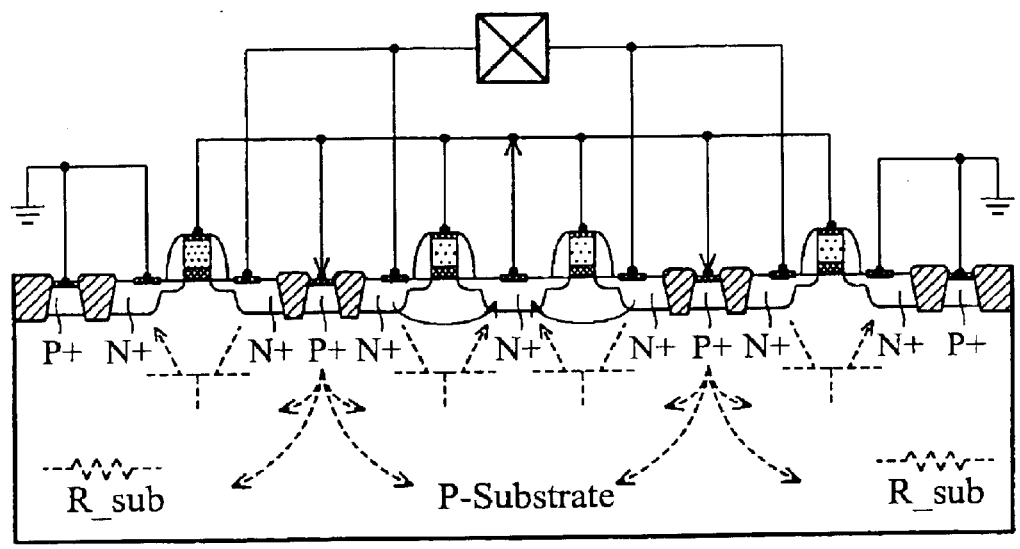
FIG. 12 shows a cross section of a ESD protection circuit with self-substrate and self-gate triggered technique.

Detailed configuration and cross-section are shown in FIG. 11 and FIG. 12, respectively. Similar to the prior two embodiments, the current of center finger device Fn/2 will bias the gates and bases of all the other finger devices simultaneously as the ESD pulse is applied to the input/output pad 200. Therefore this design can also reduce the trigger voltage of the ESD protection circuit, improve the turn-on uniformity of the ESD protection circuit and further increase the ESD level.

The Fourth Embodiment
(Multi-finger Device as Triggered Device)

Figure 13:
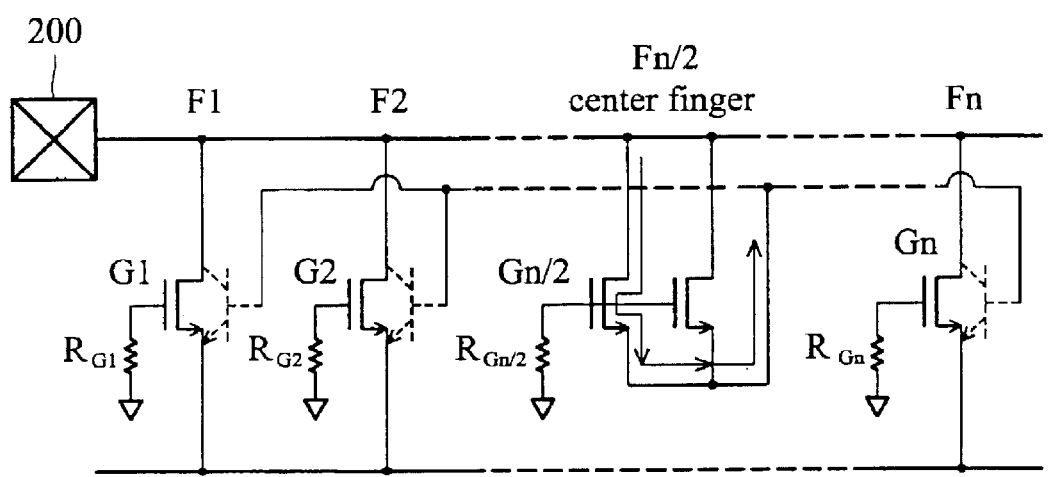
FIG. 13 is a schematic diagram showing an ESD protection circuit with multi-finger triggered devices.

FIG. 13 shows the fourth embodiment. An electrostatic discharge protection circuit in FIG. 13 is similar to that in FIG. 5 except for having a number of finger NMOS with the largest substrate resistance.

The fourth embodiment has the advantage that the finger numbers of triggering devices can be tuned to optimize the design. If larger trigger current or faster turning on is required, the center two or three finger devices, depending on requirement, can be used as trigger devices to fit the specifications and optimize the ESD protection circuit. The configuration is shown in FIG. 13.

The number of the finger NMOS is selected to optimize a trigger current of the electrostatic discharge protection circuit. The same rule is suitable for the first, second, and third embodiments.

Although the present invention has been described in its preferred embodiment, it is not intended to limit the invention to the precise embodiment disclosed herein. Those who are skilled in this technology can still make various alterations and modifications without departing from the scope and spirit of this invention. Therefore, the scope of the present invention shall be defined and protected by the following claims and their equivalents.

What is claimed is:

1. An electrostatic discharge protection circuit for an integrated circuit having an input/output pad comprising:
   a MOS transistor having plural finger devices wherein some finger devices have parasitic bipolar transistors and have drains coupled to the input/output pad, sources coupled to a potential, and at least one finger device, each having a substrate resistance exceeding those of other finger devices, has its source coupled to bases of the parasitic bipolar transistors.

2. The electrostatic discharge protection circuit as claimed in claim 1 wherein the finger device, having the substrate resistance exceeding those of other finger devices, is a center finger device.

3. The electrostatic discharge protection circuit as claimed in claim 1 wherein the finger device, having the substrate resistance exceeding those of other finger devices, is selected to optimize a trigger current of the electrostatic discharge protection circuit.

4. The electrostatic discharge protection circuit as claimed in claim 2 wherein, when an ESD zapping is occurred in the input/output pad, the center finger device is triggered on and results in a current to turn on all the other parasitic bipolar transistors.

5. The electrostatic discharge protection circuit as claimed in claim 1 wherein the finger devices have gates coupled to the potential.

6. The electrostatic discharge protection circuit as claimed in claim 1 wherein the finger devices have gates coupled to a pre-driver.

7. The electrostatic discharge protection circuit as claimed in claim 1 wherein the finger device, having the substrate resistance exceeding those of other finger devices, has its source coupled to gates of the finger devices.

8. The electrostatic discharge protection circuit as claimed in claim 7 wherein the finger device, having the substrate resistance exceeding those of other finger devices and having their source coupled to gates of the finger devices, is selected to optimize a trigger current of the electrostatic discharge protection circuit.

9. An electrostatic discharge protection circuit for an integrated circuit having an input/output pad comprising:
a MOS transistor having plural finger devices wherein some finger devices have parasitic bipolar transistors and have drains coupled to the input/output pad, sources coupled to a potential, and at least one finger device, each having a substrate resistance exceeding those of other finger devices, has its source coupled to gates of the finger devices.

10. The electrostatic discharge protection circuit as claimed in claim 9 wherein the finger device, having the substrate resistance exceeding those of other finger devices, is a center finger device.

11. The electrostatic discharge protection circuit as claimed in claim 9 wherein the finger devices, having the substrate resistance exceeding those of other finger devices, is selected to optimize a trigger current of the electrostatic discharge protection circuit.

12. The electrostatic discharge protection circuit as claimed in claim 9 wherein, when ESD zapping occurs in the input/output pad, the center finger device is triggered on and results in a current to turn on all the other parasitic bipolar transistors.

13. The electrostatic discharge protection circuit as claimed in claim 9 wherein the finger devices have gates coupled to the potential.

14. The electrostatic discharge protection circuit as claimed in claim 9 wherein the finger devices have gates coupled to a pre-driver.

15. The electrostatic discharge protection circuit as claimed in claim 1 wherein the finger device, having the substrate resistance exceeding those of other finger devices, has its source coupled to bases of the parasitic bipolar transistors of the finger devices.

16. The electrostatic discharge protection circuit as claimed in claim 15 wherein the finger device, having the substrate resistance exceeding those of other finger devices and having their source coupled to bases of the parasitic bipolar transistors of the finger devices, is selected to optimize a trigger current of the electrostatic discharge protection circuit.

17. An electrostatic discharge protection circuit for an integrated circuit having an input/output pad comprising:
a MOS transistor having plural finger devices wherein some finger devices have parasitic bipolar transistors and have drains coupled to the input/output pad, gates coupled to an potential, and sources coupled to a ground potential, and at least one finger device, each having a substrate resistance exceeding those of other finger devices, has its source coupled to all bases of the other parasitic bipolar transistors and all gates of the other finger devices.

18. The electrostatic discharge protection circuit as claimed in claim 17 wherein the finger device, having the substrate resistance exceeding those of other finger devices, is a center finger device.

19. The electrostatic discharge protection circuit as claimed in claim 17 wherein the finger device, having the substrate resistance exceeding those of other finger devices, is selected to optimize a trigger current of the electrostatic discharge protection circuit.

20. The electrostatic discharge protection circuit as claimed in claim 17 wherein when ESD zapping occurs in the input/output pad, the center finger device is triggered on and results in a current to turn on all the other parasitic bipolar transistors.

21. An electrostatic discharge protection circuit for an integrated circuit having an input/output pad comprising:
a MOS transistor having multi-finger device wherein some finger devices have parasitic bipolar transistors and drains coupled to the input/output pad, gates coupled to an ground potential, and sources coupled to a ground potential, and a number of plural finger devices, each having a substrate resistance exceeding those of other finger devices, wherein the plural finger devices have sources coupled to all bases of the parasitic bipolar transistors of the finger devices.

22. The electrostatic discharge protection circuit as claimed in claim 21 wherein the number is selected to optimize a trigger current of the electrostatic discharge protection circuit.

* * * * *